United States Patent
Kim et al.

(10) Patent No.: US 8,800,137 B2
(45) Date of Patent: Aug. 12, 2014

(54) METHOD OF MANUFACTURING PRINTED CIRCUIT BOARD

(75) Inventors: Jin Su Kim, Seoul (KR); Seog Moon Choi, Seoul (KR)

(73) Assignee: Samsung Electro-Mechanics Co., Ltd., Gyunggi-Do (KR)

( * ) Notice: Subject to any disclaimer, the term of this patent is extended or adjusted under 35 U.S.C. 154(b) by 1177 days.

(21) Appl. No.: 12/730,128

(22) Filed: Mar. 23, 2010

(65) Prior Publication Data

US 2011/0126409 A1    Jun. 2, 2011

(30) Foreign Application Priority Data

Nov. 30, 2009   (KR) .................. 10-2009-0117251

(51) Int. Cl.
*H05K 3/20*    (2006.01)

(52) U.S. Cl.
USPC ............... 29/831; 29/835; 29/838; 29/846; 29/854; 361/679.08; 439/595; 439/637

(58) Field of Classification Search
USPC ............. 29/831, 835, 838, 846, 854; 156/184–289; 174/254, 520, 522, 536; 361/679.08–679.59; 439/595, 637
See application file for complete search history.

(56) References Cited

U.S. PATENT DOCUMENTS

| 7,257,887 | B2* | 8/2007 | Lee ............................. | 29/743 |
| 2001/0048157 | A1* | 12/2001 | Murtuza ...................... | 257/734 |
| 2005/0140025 | A1* | 6/2005 | Murtuza ...................... | 257/778 |
| 2005/0274003 | A1* | 12/2005 | Lee ............................. | 29/743 |

FOREIGN PATENT DOCUMENTS

| JP | 63-140556 | 6/1998 |
| KR | 1020050056351 A | 6/2005 |

OTHER PUBLICATIONS

Office Action issued from Chinese Patent Office for counterpart Korean Patent Application No. 10-2009-0117251, Apr. 27, 2012, 6 pages.

* cited by examiner

*Primary Examiner* — Paul D Kim
(74) *Attorney, Agent, or Firm* — Bracewell & Giuliani LLP; Brad Y. Chin

(57) ABSTRACT

Embodiments of the invention provide a method of manufacturing a printed circuit board, including: mounting a strip substrate on a fixing member; separating the strip substrate into unit substrates by performing a singulation process; attaching solder balls onto the unit substrates using a jig; and fixing the solder balls on the unit substrates by performing a reflow process. The method of manufacturing a printed circuit board is advantageous in that the solder balls can be accurately formed at the predetermined positions of the strip substrate because they are attached to the unit substrates after the warpage of the strip substrate was reduced by a singulation process.

8 Claims, 6 Drawing Sheets

METHOD OF MANUFACTURING PRINTED CIRCUIT BOARD

CROSS REFERENCE TO RELATED APPLICATION

This application claims the benefit of Korean Patent Application No. 10-2009-0117251, filed Nov. 30, 2009, entitled "Fabricating Method Of Printed Circuit Board", which is hereby incorporated by reference in its entirety into this application.

BACKGROUND OF THE INVENTION

1. Technical Field

The present invention relates to a method of manufacturing a printed circuit board.

2. Description of the Related Art

Since densification, thinness, miniaturization and electrical improvements are being demanded by semiconductor packages, a substrate is becoming thinner and an electronic component-embedded substrate in which an electronic component is mounted and protected is being increasingly used. However, as the substrate becomes thinner, there is a problem in that the supporting force of the substrate is decreased, and thus the warpage thereof is increased. In particular, an electronic component-embedded substrate is problematic in that, after it is encapsulated with an epoxy molding compound (EMC), it becomes warped because of the difference in the thermal expansion coefficient. Therefore, owing to the increase in the warpage of a substrate, it is difficult to accurately attach solder balls at the predetermined positions of the substrate.

FIGS. 1A to 1E are sectional views showing a conventional method of manufacturing a printed circuit board. Hereinafter, conventional problems will be described with reference to FIGS. 1A to 1E.

First, as shown in FIG. 1A, a strip substrate 1 is provided. Here, the strip substrate 1 may be an electronic component-embedded substrate on which an electronic component is encapsulated with an epoxy molding compound (EMC) 5. This strip substrate 1 becomes warped because of the difference in thermal expansion coefficient between the substrate and the EMC 5.

Subsequently, as shown in FIG. 1B, flux 2 is applied onto the strip substrate 1. Here, since the strip substrate 1 is warped, there is a problem in that the flux 2 is not accurately applied at the predetermined positions of the strip substrate 1.

Subsequently, as shown in FIG. 1C, solder balls 3 are attached to the strip substrate 1. Here, the solder balls 3 are attached using a jig. In this case, since the strip substrate 1 is warped, there is also a problem in that the solder balls 3 are not accurately attached at the predetermined positions of the strip substrate 1, and collect at the specific parts of the strip substrate 1.

Subsequently, as shown in FIGS. 1D and 1E, a reflow process and a singulation process are performed. In the reflow process, the solder balls 3 are fixed through heat treatment, and, in this procedure, the strip substrate 1 is additionally warped. Therefore, since the solder balls 3 are not accurately attached at the predetermined positions of the strip substrate 1 and the strip substrate 1 becomes additionally warped through the reflow process, when the strip substrate 1 is separated into unit substrates 4 through the singulation process, there are problems in that the solder balls 3 are not accurately attached at the predetermined positions of each of the unit substrates 4, and each of the unit substrates 4 is also considerably warped.

Further, the conventional method of manufacturing a printed circuit board is uneconomical because expensive equipment is required and equipment suitable for the strip substrate 1 must be provided whenever the kind of strip substrate 1 is changed. Although technologies for attaching solder balls using a screen printing process have been developed, these technologies are also difficult to be practically used when the strip substrate 1 is warped because the screen printing process premises that the strip substrate is flat.

Therefore, various solutions for decreasing the warpage of the strip substrate 1 have been proposed, but most of the solutions are problematic in that they require high production cost and are difficult to be put into practical use due to the change in the raw material and design of the substrate.

SUMMARY OF THE INVENTION

Accordingly, the present invention has been devised to solve the above-mentioned problems, and the present invention provides a method of manufacturing a printed circuit board, in which solder balls can be accurately formed at predetermined positions by attaching the solder balls after performing a singulation process.

An aspect of the present invention provides a method of manufacturing a printed circuit board, including: mounting a strip substrate on a fixing member; separating the strip substrate into unit substrates by performing a singulation process; attaching solder balls onto the unit substrates using a jig; and fixing the solder balls on the unit substrates by performing a reflow process.

Here, in the mounting of the strip substrate, the fixing member may be dicing tape.

The method of manufacturing a printed circuit board may further include: integrally mounting the unit substrates on a support plate before the attaching of the solder balls.

The support plate may fix the unit substrates by vacuum-adsorbing the unit substrates.

The method of manufacturing a printed circuit board may further include: applying flux onto the unit substrates using a jig before the attaching of the solder balls.

The method of manufacturing a printed circuit board may further include: applying flux onto the solder balls before the attaching of the solder balls.

The method of manufacturing a printed circuit board may further include: mounting the unit substrates on a tray for reflow before the fixing of the solder balls.

Another aspect of the present invention provides a method of manufacturing a printed circuit board, including: mounting a strip substrate on a fixing member; separating the strip substrate into unit substrates by performing a singulation process; attaching solder balls onto the unit substrates using a mask disposed on the unit substrates; and fixing the solder balls on the unit substrates by performing a reflow process.

Here, in the mounting of the strip substrate, the fixing member may be dicing tape.

The method of manufacturing a printed circuit board may further include: integrally mounting the unit substrates on a support plate before the attaching of the solder balls.

The support plate may fix the unit substrates by vacuum-adsorbing the unit substrates.

The method of manufacturing a printed circuit board may further include: applying flux onto the unit substrates using a mask disposed on the unit substrates before the attaching of the solder balls.

The method of manufacturing a printed circuit board may further include: mounting the unit substrates on a tray for reflow before the fixing of the solder balls.

Various objects, advantages and features of the invention will become apparent from the following description of embodiments with reference to the accompanying drawings.

The terms and words used in the present specification and claims should not be interpreted as being limited to typical meanings or dictionary definitions, but should be interpreted as having meanings and concepts relevant to the technical scope of the present invention based on the rule according to which an inventor can appropriately define the concept of the term to describe the best method he or she knows for carrying out the invention.

BRIEF DESCRIPTION OF THE DRAWINGS

The above and other objects, features and advantages of the present invention will be more clearly understood from the following detailed description taken in conjunction with the accompanying drawings, in which.

DESCRIPTION OF THE PREFERRED EMBODIMENTS

Figure 1A:
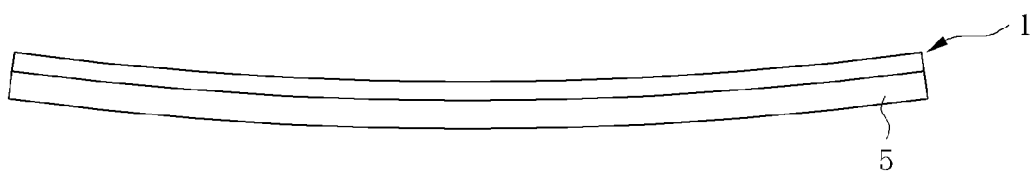
FIGS. 1A to 1E are sectional views sequentially showing a conventional method of manufacturing a printed circuit board.
Figure 1B:
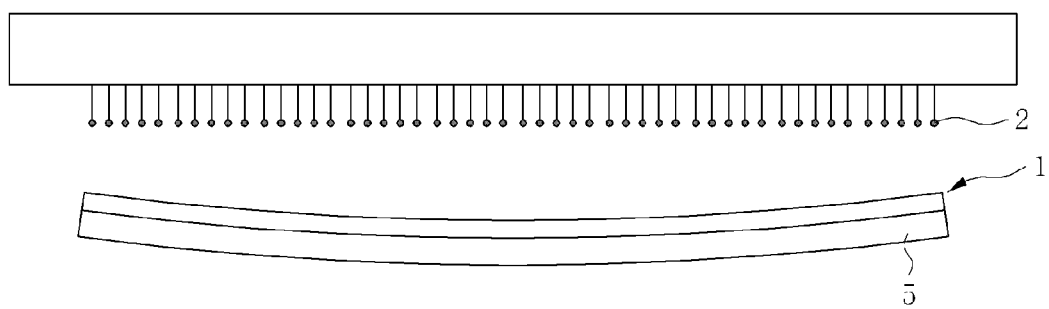
Figure 1C:
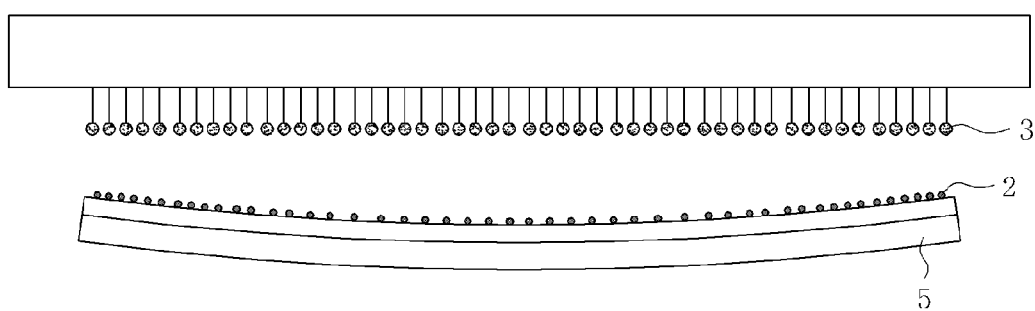
Figure 1D:
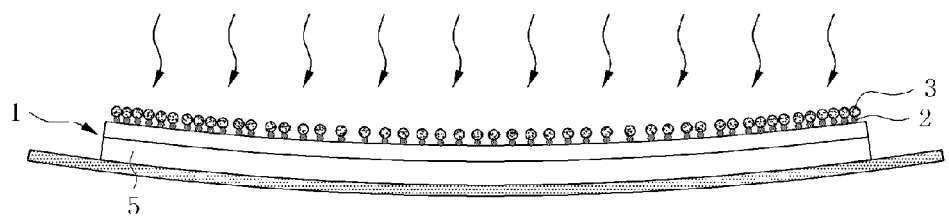
Figure 1E:
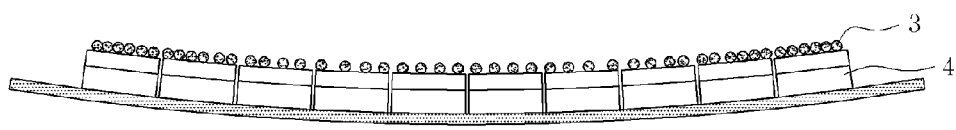

The objects, features and advantages of the present invention will be more clearly understood from the following detailed description and preferred embodiments taken in conjunction with the accompanying drawings. Throughout the accompanying drawings, the same reference numerals are used to designate the same or similar components, and redundant descriptions thereof are omitted. Further, in the description of the present invention, when it is determined that the detailed description of the related art would obscure the gist of the present invention, the description thereof will be omitted.

Hereinafter, preferred embodiments of the present invention will be described in detail with reference to the attached drawings.

FIGS. 2 to 6 are sectional views sequentially showing a method of manufacturing a printed circuit board according to an embodiment of the present invention.

The method of manufacturing a printed circuit board according to this embodiment includes the steps of: (A) mounting a strip substrate 100 on a fixing member 110; (B) separating the strip substrate 100 into unit substrates 200 through a singulation process; (C) attaching solder balls 130 onto the unit substrates 200 using a jig 140; and (D) fixing the solder balls 130 on the unit substrates 200 through a reflow process.

Figure 2:
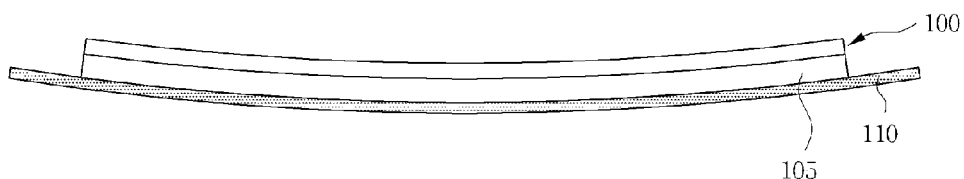
FIGS. 2 to 6 are sectional views sequentially showing a method of manufacturing a printed circuit board according to an embodiment of the present invention.

First, as shown in FIG. 2, a strip substrate 100 is mounted on a fixing member 110. Here, the strip substrate 100 is present in a state of having been warped due to the difference in the thermal expansion coefficient between a substrate and an epoxy molding compound (EMC) 105 and the decrease in thickness of a printed circuit board. Since a singulation process must be performed later in order to stretch the warped strip substrate 100, the strip substrate 100 is mounted on the fixing member 110. The fixing member 110 is not particularly limited as long as it can stably support the strip substrate 100 during a singulation process. Preferably, dicing tape may be used as the fixing member 110.

Figure 3:
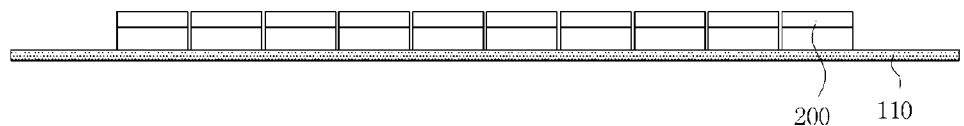

Subsequently, as shown in FIG. 3, the strip substrate 100 is separated into unit substrates 200. The separation of the strip substrate 100 into the unit substrates 200 is performed by a general singulation process. The unit substrates 200 separated from the strip substrate 100 are maintained in a state in which they are integrally mounted on the fixing member 110, such as dicing tape or the like. In this procedure, since the strip substrate 100 is separated into the unit substrates 200, the warpage of the strip substrate 100 is decreased. Thus, in the following procedure, flux 150 and solder balls 130 can be accurately attached at the predetermined positions of the strip substrate 100.

Figure 4A:
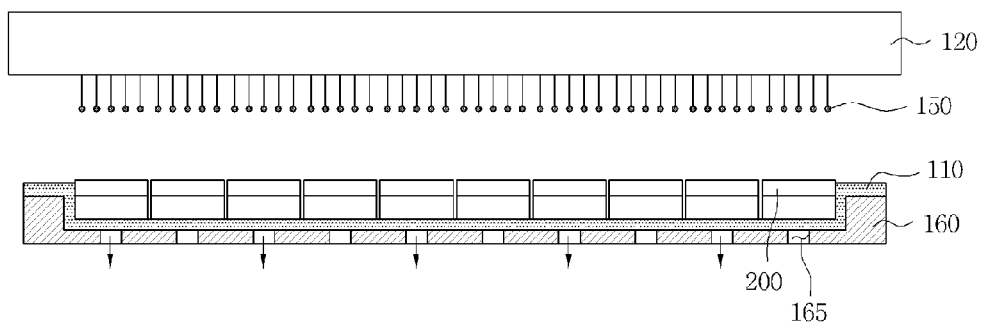
Figure 4B:
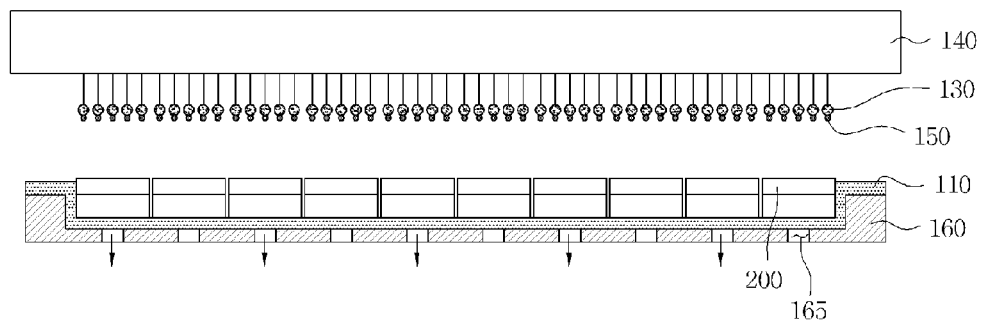

Subsequently, as shown in FIGS. 4A and 4B, flux 150 is applied on the strip substrate 100. Here, flux 150 is a material which removes an oxide film from a substrate pad made of copper or the like and chemically activates the substrate pad such that solder balls 130 easily attach to the substrate pad. The flux 150 is applied onto the pads of the unit substrates 200, to which the solder balls are to be attached, using a jig 120 (refer to FIG. 4A) or are directly applied onto the solder balls using the jig 120 (refer to FIG. 4B). Meanwhile, when the flux 150 is applied onto the unit substrates 200 using the jig 120, since the warpage of the strip substrate 100 was previously decreased through a singulation process, the flux 150 can be accurately applied at the predetermined positions of the unit substrates 200. However, this procedure does not have to be necessarily performed, and, particularly, in the case of a flux-free soldering process, this procedure may be omitted.

Figure 5:
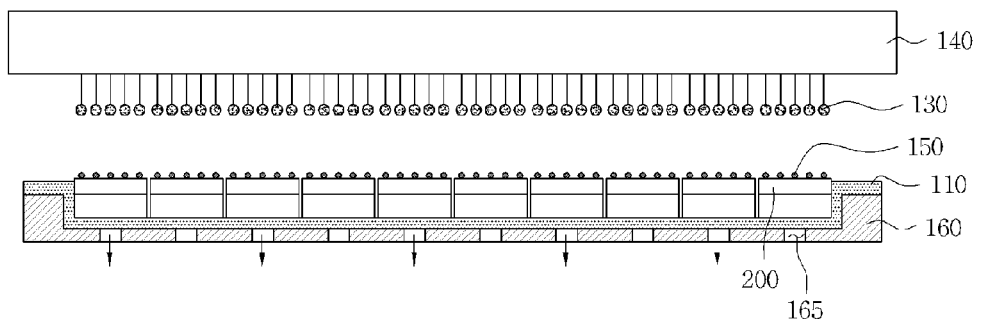

Subsequently, as shown in FIG. 5, solder balls 130 are attached onto the unit substrates 200. Here, the solder balls 130 serve to connect the unit substrates 200 with external circuits, such as a mother board and the like, and are attached onto the unit substrates 200 using a jig 140. Further, the solder balls 130 are temporarily attached onto the unit substrates 200 by the flux 150, and are completely fixed on the unit substrates 200 by a reflow process later. Since the warpage of the strip substrate 100 is previously decreased through a singulation process, the solder balls 130 can be accurately attached at the predetermined positions of the unit substrates 200.

Meanwhile, the lead time can be shortened by performing the step of applying the flux 150 onto the unit substrates 150 and the step of attaching the solder balls 130 onto the unit substrates 200 in a state in which the unit substrates 150 separated from the strip substrate 100 are integrally mounted on the fixing member 110. Further, at the time of applying the flux 150 and attaching solder balls 150, a support plate 160 may be employed in order to provide bearing resistance to the unit substrates 200. Here, the support plate 160 fixes the unit substrates 200 by vacuum-adsorbing the unit substrates 200 through suction holes 165, so that the residual warpage of the unit substrates 200 can be further decreased and the movement of the unit substrates 200 can be prevented, with the result that the flux 150 can be accurately applied at the predetermined positions of the unit substrates 200 and the solder balls 130 can accurately attach at the predetermined positions thereof. Further, the unit substrates 200 may be mounted on the support plate 160 in a state in which they are integrally mounted on the fixing member 110.

Figure 6A:
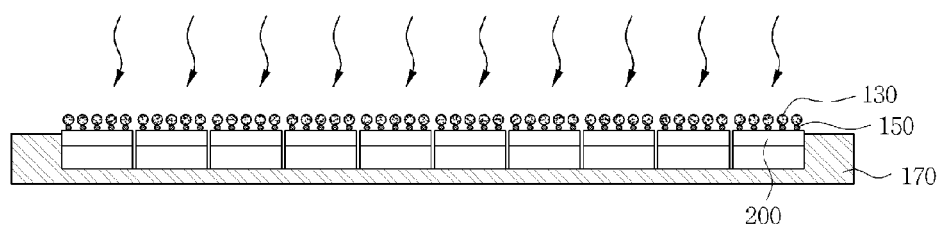
Figure 6B:
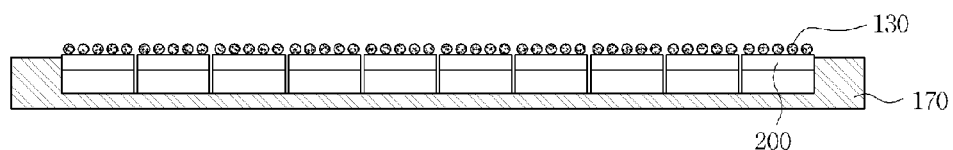

Subsequently, as shown FIGS. 6A and 6B, the solder balls 130 are fixed on the unit substrates 200 by a reflow process. The reflow process is a process of solidifying the solder balls 130 by heating, melting and then cooling them. In this case, since the unit substrates 200 are also heated to high temperature, a heat-resistant tray 170 for reflow may be employed. That is, after the dicing tape previously used as the fixing member 110 is removed, the unit substrates 200 are mounted on the tray 170 for reflow, and then the reflow process is performed. The unit substrates 200 may be mounted on the tray 170 for reflow using an adsorption nozzle.

However, when dicing tape having heat resistance is employed, the reflow process may be performed in a state in which the unit substrates 200 are mounted on the dicing tape without mounting them on the tray 170 for reflow.

Meanwhile, in this embodiment, differently from conventional technologies, since the reflow process is performed in a state in which the strip substrate 100 is separated into the unit substrates 200, the additional warpage of the strip substrate 100 occurring in the reflow process can be reduced.

The method of manufacturing a printed circuit board according to this embodiment is advantageous in that the solder balls 130 can be accurately formed at the predetermined positions of the strip substrate 100 because they are attached to the unit substrates 200 after the warpage of the strip substrate 100 was reduced by a singulation process. Further, the method of manufacturing a printed circuit board according to this embodiment is advantageous in that the manufacturing cost of a printed circuit board can be lowered because the jigs 120 and 140 used to apply the flux 150 or to attach the solder balls 130 can be used in the same way as before. Furthermore, the method of manufacturing a printed circuit board according to this embodiment is advantageous in that the lead time in this method does not differ from the lead time of the conventional method which is performed in a state in which the strip substrate 100 is not separated into the unit substrates 200 because this method is performed in a state in which the separated unit substrates 200 are integrally mounted on the fixing member 110 or the tray 170 for reflow.

FIGS. 7 to 11 are sectional views sequentially showing a method of manufacturing a printed circuit board according to another embodiment of the present invention.

The method of manufacturing a printed circuit board according to this embodiment includes the steps of: (A) mounting a strip substrate 100 on a fixing member 110; (B) separating the strip substrate 100 into unit substrates 200 by a singulation process; (C) attaching solder balls 130 onto the unit substrates 200 using a mask 145 disposed on the unit substrates 200; and (D) fixing the solder balls 130 on the unit substrates 200 by a reflow process.

This embodiment greatly differs from the above-mentioned embodiment in a process of attaching solder balls. Therefore, the differences therebetween will be mainly described, and a redundant description thereof will be omitted.

Figure 7:
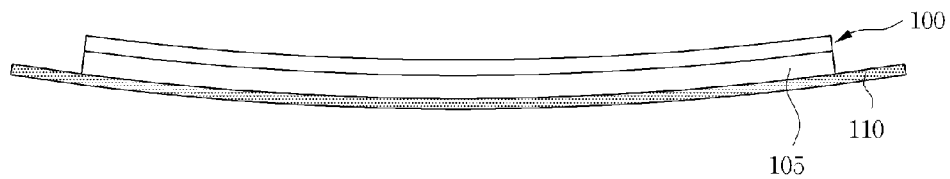
FIGS. 7 to 11 are sectional views sequentially showing a method of manufacturing a printed circuit board according to another embodiment of the present invention.
Figure 8:
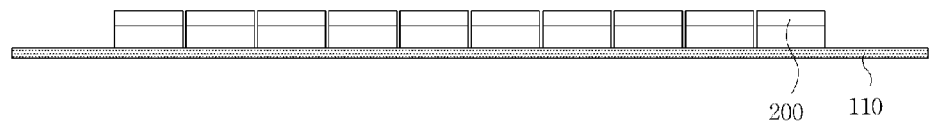

First, as shown in FIGS. 7 and 8, a strip substrate 100 is mounted on a fixing member 110, and is then separated into unit substrates 200. Specifically, the strip substrate 100 is mounted on the fixing member, such as dicing tape or the like, and then a singulation process is used to separate the strip substrate 100 into the unit substrates 200 in order to stretch the warped strip substrate 100.

Figure 9:
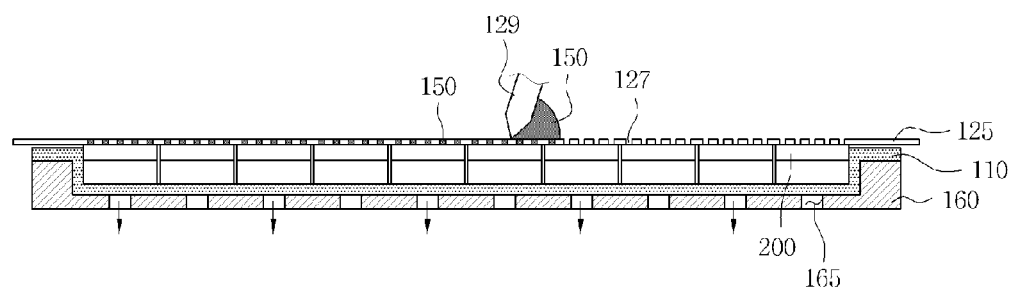

Subsequently, as shown in FIG. 9, flux 150 is applied on the unit substrates 200. In this embodiment, differently from the above-mentioned embodiment, the flux 150 is applied on the unit substrates 200 using a screen printing process after a mask 125 is disposed on the unit substrates 200. More specifically, the flux 150 is applied on the unit substrates 200 by disposing the mask 125 provided with openings 127 on one side of the unit substrates 200 and then pressing the flux 150 onto the unit substrates 200 through the openings 127 using a squeegee. In order to accurately apply the flux 150 at predetermined positions of the unit substrates 200, it is preferred to suitably control the hardness, fixed angle, velocity and pressure applied to the substrate by the squeegee 129. In the present invention, differently from conventional technologies, a screen printing process based on the premise that a printed circuit board is flat can be performed because the warpage of a printed circuit board was decreased through a singulation process. However, like the above-mentioned embodiment, this procedure may be omitted in the case of a flux-free soldering process.

Figure 10:
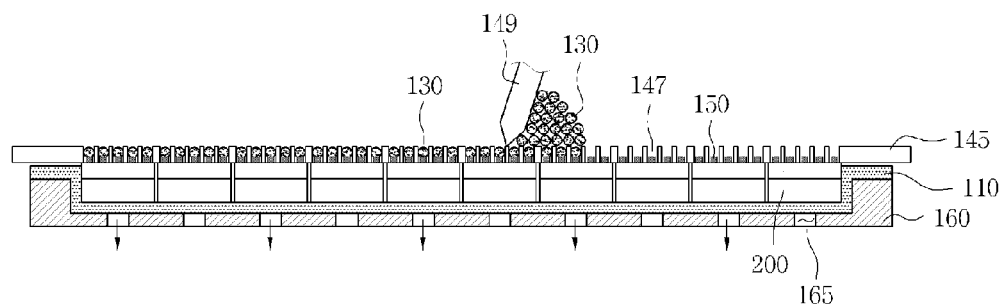

Subsequently, as shown in FIG. 10, solder balls 130 are attached onto the unit substrates 200. Here, the solder balls 130, like the procedure of applying the flux 150, are applied on the unit substrates 200 using a screen printing process after a mask 145 is disposed on the unit substrates 200. More specifically, the solder balls 130 are applied on the unit substrates 200 by disposing the mask 145 provided with openings 147 on one side of the unit substrates 200 and then pressing the solder balls 130 onto the unit substrates 200 through the openings 147 using a squeegee. The solder balls 130 can be attached at predetermined positions of the unit substrates 200 because a singulation process is used to decrease the warpage of a printed circuit board.

Meanwhile, as in the above-mentioned embodiment, the lead time can be shortened by performing the step of applying the flux 150 onto the unit substrates 150 and the step of attaching the solder balls 130 onto the unit substrates 200 in a state in which the unit substrates 150 separated from the strip substrate 100 are integrally mounted on the fixing member 110. Further, at the time of applying the flux 150 and attaching solder balls 150, a support plate 160 may be employed in order to provide bearing resistance to the unit substrates 200. The support plate 160 fixes the unit substrates 200 by vacuum-adsorbing the unit substrates 200 through suction holes 165, so that the residual warpage of the unit substrates 200 can be further decreased and the movement of the unit substrates 200 can be prevented, with the result that the flux 150 can be accurately applied at the predetermined positions of the unit substrates 200 and the solder balls 130 can be accurately attached at the predetermined positions thereof.

Figure 11A:
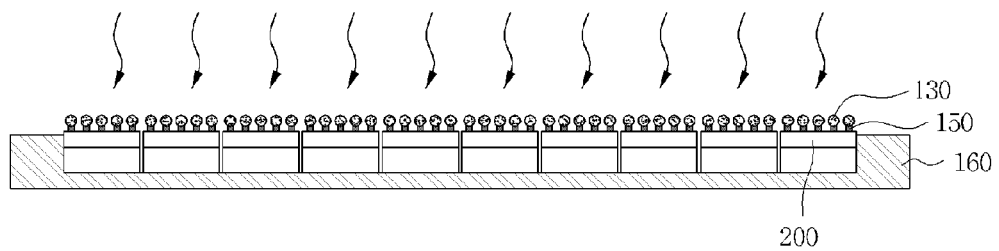
Figure 11B:
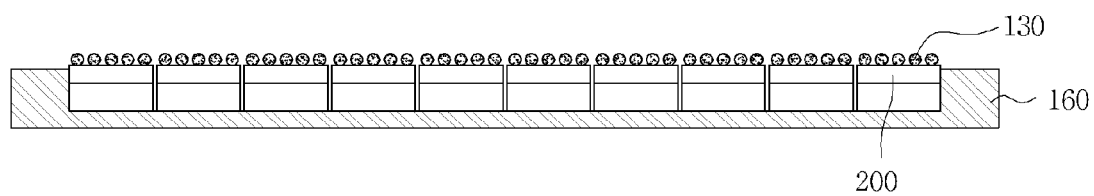

Subsequently, as shown FIGS. 11A and 11B, the solder balls 130 are fixed on the unit substrates 200 by a reflow process. In this embodiment, the reflow process may be performed by mounting the unit substrates 200 on a heat-resistant tray 170 for reflow because the unit substrates 200 are heated to high temperature.

The method of manufacturing a printed circuit board according to this embodiment is advantageous in that a singulation process was previously performed to decrease the warpage of a printed circuit board, so that a screen printing process based on the premise that a printed circuit board is flat can be performed, thereby reducing the cost necessary for a high-priced apparatus, such as a flux dotting tool or the like.

As described above, the method of manufacturing a printed circuit board according to the present invention is advantageous in that the solder balls can be accurately formed at the predetermined positions of the strip substrate because they are attached to the unit substrates after the warpage of the strip substrate was reduced by a singulation process, and in that the additional warpage of the strip substrate occurring in a reflow process can be reduced because the reflow process is performed after the strip substrate is separated into unit substrates by performing the singulation process.

Further, the method of manufacturing a printed circuit board according to the present invention is advantageous in that solder balls can be attached to unit substrates using a screen printing method because a singulation process reduces the warpage of a strip substrate, and in that the expenditures necessary for a high-priced apparatus, such as a flux dotting tool or the like, can be reduced because the screen printing method is used.

Furthermore, the method of manufacturing a printed circuit board according to the present invention is advantageous in that it can also be used in a wafer leveling process.

Although the preferred embodiments of the present invention have been disclosed for illustrative purposes, those skilled in the art will appreciate that various modifications, additions and substitutions are possible, without departing from the scope and spirit of the invention as disclosed in the accompanying claims. Simple modifications, additions and substitutions of the present invention belong to the scope of the present invention, and the specific scope of the present invention will be clearly defined by the appended claims.

What is claimed is:

1. A method of manufacturing a printed circuit board, comprising:
   mounting a strip substrate on a fixing member;
   separating the strip substrate into unit substrates equipped with a pad in a state in which a plurality of unit substrates is integrally mounted on the fixing member by performing a singulation process;
   attaching solder balls onto the pad of the unit substrates using a jig in a state in which the plurality of unit substrates separated from the strip substrate is integrally mounted on the fixing member; and
   fixing the solder balls on the unit substrates by performing a reflow process.

2. The method of manufacturing a printed circuit board according to claim 1, wherein, in the mounting of the strip substrate, the fixing member is dicing tape.

3. The method of manufacturing a printed circuit board according to claim 1, further comprising: integrally mounting the unit substrates on a support plate before the attaching of the solder balls.

4. The method of manufacturing a printed circuit board according to claim 3, wherein the support plate fixes the unit substrates by vacuum-adsorbing the unit substrates.

5. The method of manufacturing a printed circuit board according to claim 1, further comprising: applying flux onto the unit substrates using a jig before the attaching of the solder balls.

6. The method of manufacturing a printed circuit board according to claim 1, further comprising: applying flux onto the solder balls before the attaching of the solder balls.

7. The method of manufacturing a printed circuit board according to claim 1, further comprising: mounting the unit substrates on a tray for reflow before the fixing of the solder balls.

8. A method of manufacturing a printed circuit board, comprising:
   mounting a strip substrate on a fixing member;
   separating the strip substrate into unit substrates equipped with a pad in a state in which a plurality of unit substrates is integrally mounted on the fixing member by performing a singulation process;
   attaching solder balls onto the pad of the unit substrates in a state in which the plurality of unit substrates separated from the strip substrate is integrally mounted on the fixing member; and
   fixing the solder balls on the unit substrates by performing a reflow process.

* * * * *